United States Patent [19]

Spies

[11] 3,740,580

[45] June 19, 1973

[54] THRESHOLD VALUE SWITCH

[75] Inventor: Johann Spies, Pfaffenhofen/Ilm, Germany

[73] Assignee: Messerschmitt-Bolkow-Blohm Gesellschaft Mit Beschrankter Haftung, Munich, Germany

[22] Filed: Jan. 26, 1972

[21] Appl. No.: 221,007

[30] Foreign Application Priority Data

Feb. 13, 1971 Germany .................. P 21 06 957.8

[52] U.S. Cl. ............ 307/251, 307/235 R, 307/273, 307/279, 307/288, 307/304

[51] Int. Cl. H03k 17/30, H03k 17/72, H03k 3/284

[58] Field of Search .................. 307/205, 214, 241, 307/242, 244, 251, 273, 279, 255, 288, 304

[56] References Cited

UNITED STATES PATENTS

| | | | |
|---|---|---|---|
| 3,431,433 | 3/1969 | Ball et al. | 307/251 X |
| 3,541,353 | 11/1970 | Seelbach et al. | 307/205 X |
| 3,588,527 | 6/1971 | Cricchi | 307/304 X |
| 3,628,070 | 12/1971 | Heuner | 307/251 X |
| 3,631,528 | 12/1971 | Green | 307/237 X |
| 3,636,372 | 1/1972 | Hujita et al. | 307/288 X |
| 3,651,340 | 3/1972 | Cliff | 307/288 X |

*Primary Examiner*—John W. Huckert
*Assistant Examiner*—L. N. Anagnos
*Attorney*—John J. McGlew and Alfred E. Page

[57] ABSTRACT

The switch, which is designed for input signals of both polarities, provides an output signal when a threshold value, which is equal in magnitude for both polarities, is exceeded, and includes at least four field effect transistors of the excitation type. The transistors include two paired first field effect transistors of respective different channel type, whose gate electrodes are interconnected and connected to the midpoint of a voltage divider, interconnecting the two drain electrodes and comprising two identical resistors. Two paired second field effect transistors, of respectively different channel types, are provided, and the gate electrode of each second transistor is connected to the drain electrode of that first transistor which is of the same channel type, through the medium of a resistor, these two resistors being identical. The gate electrodes of the two second transistors are interconnected by a second voltage divider consisting of two identical resistors, and an input signal terminal of the switch is connected to the midpoint of the second voltage divider. The source electrodes of the transistors of the same channel type are connected to each other and to respective supply voltage terminals. The output signals of the switch are provided by terminals connected to the drain electrodes of the two second transistors. The setting of the threshold value can be varied by varying the supply voltage, as by using a series resistance with the supply voltage source. The switch may be modified by providing feedback arrangements.

7 Claims, 3 Drawing Figures

THRESHOLD VALUE SWITCH

FIELD OF THE INVENTION

This invention relates to threshold value switches and, more particularly, to a novel and improved threshold value switch of the type designed for input signals of both polarities and providing output signals when a threshold value, which is equal in magnitude for both polarities, is exceeded, and which includes at least four field effect transistors of the excitation type.

BACKGROUND OF THE INVENTION

Electronic threshold value switches of this type are known in many forms, with the most common threshold value switch being a multivibrator known as a Schmitt trigger. This known threshold value switch has the disadvantage, however, that either an exact reversal of the electronic switch with exactly the same threshold value with both a positive and a negative input signal is not possible, due to the hysteresis characteristic of Schmitt triggers, or that such behavior of the switch can be attained only at the expense of a considerable switching expenditure and energy consumption.

The so-called "ambush mines", used increasingly in modern weapons engineering, and which have an electronic ignition system, require threshold value switches with an extremely low current consumption and which have a switching threshold that can be varied simultaneously in both polarity directions by simple switching measures. Known unipolar trigger circuits are not suitable for this purpose, since the forward voltages of diodes already are too high for the threshold voltages used in practice, or else they have a very high current consumption at such a threshold value and which is intolerable in these types of mines because their "on set" time extends over several months. In addition, the threshold value must be maintained over the full temperature range to which military devices are exposed.

SUMMARY OF THE INVENTION

The objective of the invention is to provide a new threshold value switch which permits, with only a few electronic elements, an exact and, because of the low switching expenditure, a reliable reversal at exactly the same threshold value of positive and negative input signals.

In accordance with the invention, this problem is solved, in threshold value switches of the mentioned type, by providing two paired first field effect transistors of respective different channel type with their gate electrodes interconnected and connected to the midpoint of a voltage divider, consisting of two identical resistors, and interconnecting the two drain electrodes with each other. Two second paired field effect transistors, of respective different channel types, are provided, and their gate electrodes are connected, through identical resistors, with the respective drain electrodes of those first field effect transistors of the same channel type. The gate electrodes of the two second field effect transistors are interconnected with each other by another voltage divider consisting of two identical resistors, and the input of the threshold value switch is supplied to the midpoint of this voltage divider. The source electrodes of the field effect transistors of the same channel type are interconnected to each other and to respective terminals of a supply voltage source. The output signals of the switch are tapped at the drain electrodes of the two second field effect transistors.

By means of these field effect transistors, which are selected and combined in the above manner, it is possible to set an exactly determinable threshold value which is equal in amount for both polarities of an input signal. This threshold voltage is determined, for the two second field effect transistors, by the current flowing through the two first field effect transistors. The size of this current can be set by the supply voltage of the supply voltage source, or by a variable resistance included in the supply line of the circuit. Since four paired field effect transistors are used for the switch, temperature fluctuations have little effect on the magnitude of the threshold value.

In accordance with a further feature of the invention, the drain electrode of each second field effect transistor is connected to the gate electrode of the other field effect transistor, and this connection establishes a feedback between the two second field effect transistors so that the entire electronic threshold value switch works as a monostable multivibrator. After the threshold value of one of the two second field effect transistors is exceeded, the then conductive field effect transistor switches the other second field effect transistors into its conductive state over the feedback connection.

In one embodiment of this further feature of the invention, a respective diode, which is switched, in the state of rest, in the blocking direction, is arranged in each connection between a drain and gate electrode, and these diodes are biased in the blocking direction by respective connections with respective terminals of the supply voltage source. One connection between a drain electrode and a gate electrode has, in addition, a capacitor connected in series with the associated diode, with the respective drain electrode being connected through a resistor with the respective terminal of the supply voltage source. The diodes, which present, in the state of rest, a very high resistance, have the effect that the feedback connections are effective only when the threshold value for one of the two second field effect transistors is exceeded. The series-connected capacitor in one connection between a drain electrode and a gate electrode, with the diode, has the effect that the monostable multivibrator thus formed returns to its original state.

In accordance with another embodiment of the invention, the substrate terminal of each second field effect transistor is connected to the midpoint of a respective voltage divider connecting the drain electrode of the other second field transistor to a respective supply voltage terminal, namely, the terminal associated with the source electrode of the second field transistor whose substrate is connected to the midpoint of the voltage divider. By virtue of these connections of the substrate terminals of the two second field effect transistors, it is also possible to establish a feedback connection between the two second field effect transistors.

An object of the invention is to provide an improved threshold value switch for input signals of both polarities.

Another object of the invention is to provide such a switch which permits, with only a few electronic elements, an exact and reliable reversal at exactly the same threshold value of positive and negative input signals.

A further object of the invention is to provide such a switch including two first field effect transistors controlling conductivity of two second field effect transistors in accordance with input signals, and including feedback arrangements interconnecting the two second field effect transistors.

For an understanding of the principles of the invention, reference is made to the following description of typical embodiments thereof as illustrated in the accompanying drawing.

DESCRIPTION OF THE PREFERRED EMBODIMENTS

Figures 1, 2:
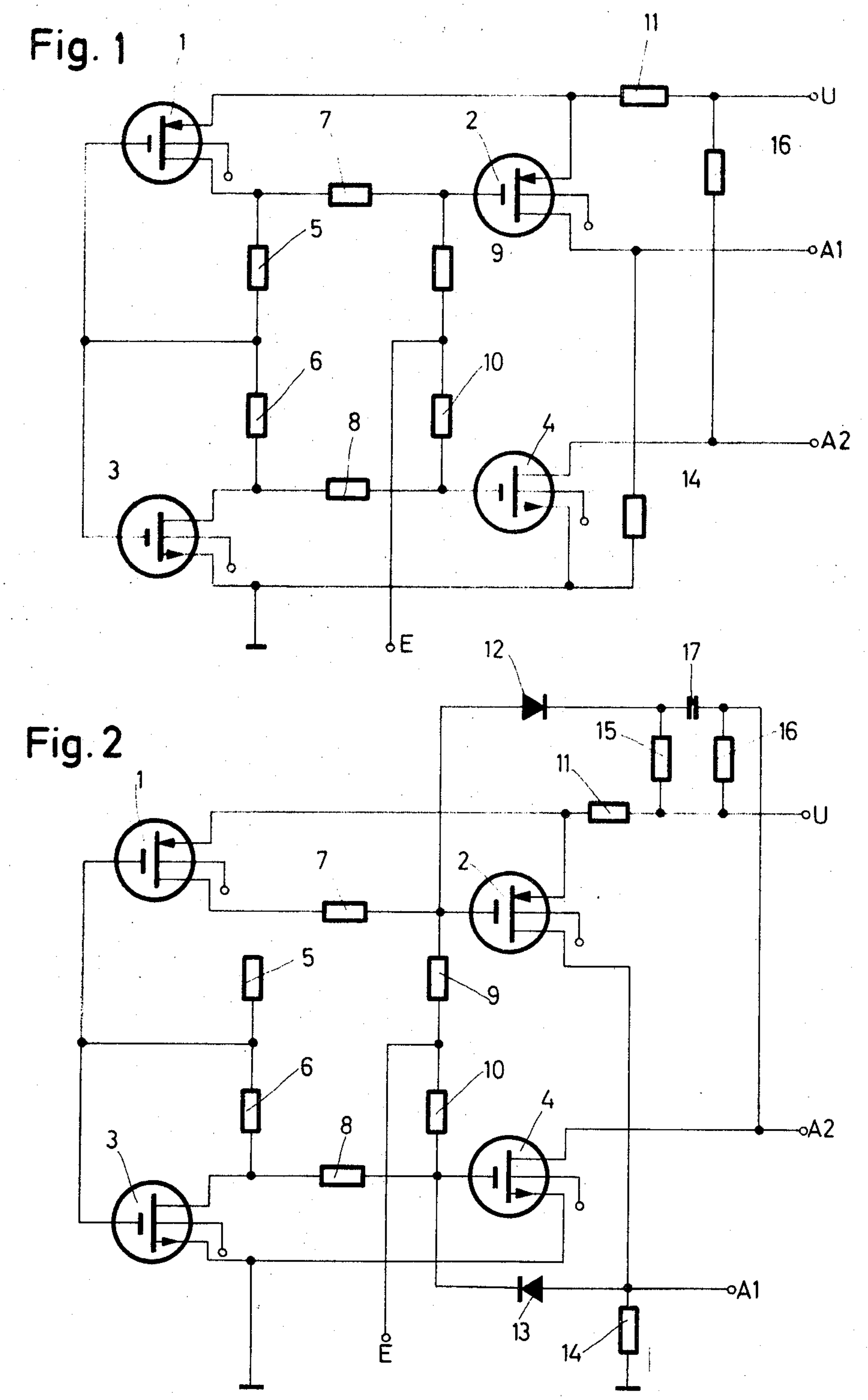
FIG. 1 is a schematic wiring diagram of a threshold value switch, embodying the invention, and without feedback relative to the two second field effect transistors.
FIG. 2 is a schematic wiring diagram of a threshold value switch, corresponding to that shown in FIG. 1, with feedback provided between the two second field effect transistors.

The threshold value switch schematically illustrated in FIG. 1 has four field effect transistors 1, 2, 3 and 4 which are matched to the extent that, independent of their channel type, all four field effect transistors have the same threshold voltage. The first pair of field effect transistors comprises the transistors 1 and 3, which are of respectively different channel types, and whose gate electrodes are interconnected with each other and with the midpoint of a voltage divider consisting of two identical resistors 5 and 6. This voltage divider interconnects the two drain electrodes of field effect transistors 1 and 3. The drain electrodes of transistors 1 and 3 are additionally connected, through resistors 7 and 8, to the gate electrodes of the two second field effect transistors 2 and 4. These second field effect transistors are also of respective different channel types and are associated with the two first field effect transistors in such a manner that transistors 1 and 2 are connected with each other through their drain and gate electrodes and are of the same channel type, while transistors 3 and 4, interconnected through their drain and gate electrodes, are of the other channel type.

Another voltage divider interconnects the gate electrodes of transistors 2 and 4, and consists of two identical resistors 9 and 10. The midpoint of this other voltage divider is connected to the signal input terminal E of the threshold value switch. The source electrodes of field effect transistors 1 and 2 are interconnected with each other and, through a resistor 11, to one terminal U of a supply voltage source, which has not been shown. The source electrodes of field effect transistors 3 and 4 are also interconnected with each other and with the other terminal of the supply voltage source, which is here indicated as being ground. The drain electrodes of transistors 2 and 4 are connected to the respective outputs A1 and A2 of the threshold value switch. The drain electrode of transistor 2 is connected through a resistor 14 to the ground connected to the source electrode of transistor 4, and the drain electrode of transistor 4 is connected through a resistor 16 to the terminal U connected to the source electrode of transistor 2.

Through resistor 11 and the source-drain zone of the two first transistors 1 and 3, as well as over resistors 5 and 6 of the first voltage divider, there flows a current determined by these resistors and the magnitude of the supply voltage source, since the gate electrodes of both transistors are set to such a threshold value that both field effect transistors are conductive. The drain electrode of the field effect transistor 3 has a voltage which corresponds to the threshold voltage between its gate and source electrode, but which is reduced by the voltage drop caused by the current through resistor 6. The same voltage values appertain to field effect transistor 1, that is, the drain voltage of this field effect transistor, related to the source electrode, corresponds to the threshold value less the voltage drop appearing on resistor 5.

This voltage is effective over a voltage divider consisting of the resistors 7, 8, 9 and 10, and these four resistors can all have, for example, the same possibly high ohmic value. Field effect transistor 2 therefore receives the threshold voltage of field effect transistor 3, reduced by one-half the voltage drop appearing across resistor 6, and field effect transistor 4 receives the threshold voltage of field effect transistor 1 reduced by one-half the voltage drop appearing across resistor 5. If an AC voltage is supplied through input terminal E to the threshold value switch and exceeds this threshold voltage, field effect transistor 4 will become conductive with a positive amplitude and supply, at its output A1, a corresponding signal. The threshold value for both polarities can be set symmetrically, by the shunt current flowing through resistors 5 and 6, by varying, for example, resistor 11 or by the supply voltage provided by the supply voltage source.

If field effect transistors with insulated gate electrodes are used for the circuit shown in FIG. 1, all the resistors, including resistors 5 and 6, can be very high ohmic, so that the entire circuit uses a residual current of the order of only 10 microamperes, since the field effect transistors 2 and 4 are only conductive when one of the threshold voltages is exceeded by the input signal. If the paired field effect transistors used were unsymmetrical with respect to their threshold voltages, this can be compensated in a simple manner by the ratio of resistors 5 and 6, or by the voltage divider consisting of resistors 7, 8, 9 and 10.

The circuit arrangement shown in FIG. 2 differs, in its arrangement and method of operation, from that shown in FIG. 1, only by the fact that the gate electrode of field effect transistor 4 is additionally connected, through a diode 13 and a resistor 14, to the ground terminal of the supply voltage source, and to the drain electrode of field effect transistor 2. In the same manner, the gate electrode of field effect transistor 2 is connected, through a diode 12 and a resistor 15, to the other terminal U of the supply voltage source. The junction point between diode 12 and resistor 15 is connected through a capacitor 17 and resistor 16 to the drain electrode of field effect transistor 3.

Diodes 12 and 13 are so switched that they are biased in a blocking direction in the state of rest of the circuit. When field effect transistor 4 becomes conductive with an amplitude exceeding the threshold value, with the appearance of a positive input signal, the potential on resistor 16 is reduced so that diode 12 becomes conductive and the gate electrode of field effect transistor 2 is excited by a negative voltage. By virtue of this, a current flows also through the drain-source zone of field effect transistor 2, which further increases the threshold value on the gate electrode of field effect transistor 4 through diode 13, so that a true electric feedback appears between the two second field effect transistors, which both become fully conductive within a very short time.

At the output A2, there consequently appears a zero potential until capacitor 17 is charged, through resistor 15, to a voltage exceeding the threshold voltage of the gate electrode of field effect transistor 2. However, if a negative input signal of sufficient amplitude appears at input terminal E, field effect transistor 2 becomes conductive first, and this triggers field effect transistor 4 conductive, in a corresponding manner, through the feedback. This monostable arrangement of the threshold value switch shown in FIG. 2 is particularly suitable if a corresponding longer-lasting output signal is to be provided, despite the fact that the threshold value is exceeded only briefly by the input signal. The length of the output signal is determined by the charging time of capacitor 17.

Figure 3:
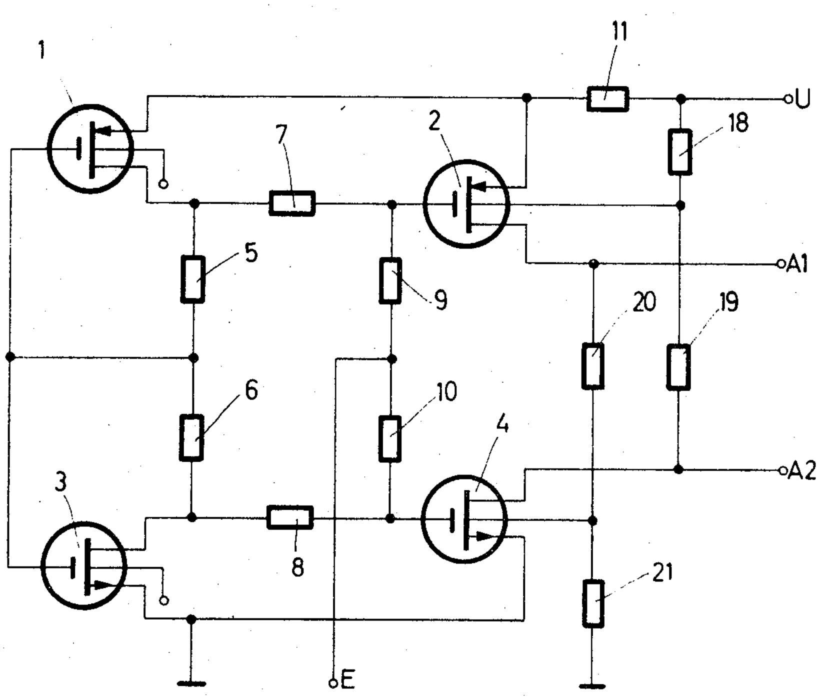
FIG. 3 is a schematic wiring diagram of a threshold value switch embodying the invention and with the feedback being provided between substrate terminals of the two second field effect transistors.

FIG. 3 illustrates another embodiment of a feedback threshold value switch, where the feedback is effected through the substrate terminals of field effect transistors 2 and 4. Thus, the substrate terminal of field effect transistor 2 is connected to the midpoint of a voltage divider consisting of resistors 18 and 19 and which is connected between the drain electrode of field effect transistor 4 and the positive terminal U of the supply voltage source. In the same manner, the substrate terminal of field effect transistor 4 is connected to the midpoint of another voltage divider consisting of resistors 20 and 21, and which is connected between the drain electrode of the field effect transistor 2 and the ground terminal of the supply voltage source.

The substrate terminals act like the second control electrodes, and effect, for example, in *n*-channel transistors, with positive substrate bias voltage, a reduction of the threshold voltage. If the threshold voltage is exceeded, for example, in field effect transistor 4, a negative bias voltage is generated at the substrate terminal of the field effect transistor 2, so that the threshold voltage for the gate electrode of this field effect transistor is reduced. The field effect transistor 2 thus also becomes conductive and further increases the potential on the substrate terminal of field effect transistor 4.

The circuit arrangement shown in FIG. 3 also produces a true electric feedback between the field effect transistors so that, when one of the two field effect transistors becomes fully conductive, the other field effect transistor is also fully conductive. In this embodiment, a resetting of the threshold value switch, after the two second field effect transistors have been triggered conductive, can be attained only by interrupting the supply voltage or opening one of the feedback connections. Naturally, a monostable multivibrator can be built up by inserting a time constant, for example by connecting a capacitor in series with resistor 19, which always returns to its rest position, as shown by the circuit in FIG. 2, after a defined time and after the input signal has disappeared. The advantage of the circuit shown in FIG. 3 consists primarily in that the gate electrode circuit is not influenced by the feedback circuit.

It will be appreciated from the foregoing description that the threshold value switch embodying the invention is simple and reliable in its construction and method of operation, so that it is particularly suitable for military use in electric ignition circuits. The circuit arrangement is even more reliable, as compared to the special stresses occurring in military use, if the four field effect transistors are designed as integrated circuits such as already commercially available, with the necessary pairing and the different types of channels.

While specific embodiments of the invention have been shown and described in detail to illustrate the application of the principles of the invention, it will be understood that the invention may be embodied otherwise without departing from such principles.

What is claimed is:

1. A threshold value switch, for input signals of both polarities, providing an output signal when a threshold value, equal in magnitude for both polarities, is exceeded, and including at least four field effect transistors of the excitation type, said threshold value switch comprising, in combination, two paired first field effect transistors of respective different channel types; a first voltage divider, including two identical first resistors, interconnecting the drain electrodes of said first transistors; first circuit means connecting the gate electrodes of said first transistors to each other and to the midpoint of said first voltage divider; two paired second field effect transistors of respective different channel types; two identical additional resistors each connecting the gate electrode of a respective second transistor to the drain electrode of that first transistor of the same respective channel type; a second voltage divider, including two identical second resistors, interconnecting the gate electrodes of said second transistors; an input terminal connected to the midpoint of said second voltage divider; a pair of supply voltage terminals; second circuit means connecting the source electrodes of each of two transistors of the same channel type to each other and to a respective supply voltage terminal; and a pair of output signal terminals each connected to the drain electrode of a respective second transistor.

2. A threshold value switch, as claimed in claim 1, in which the setting of the threshold value can be varied by varying the voltage of the supply voltage source.

3. A threshold value switch, as claimed in claim 1, in which the setting of the threshold value can be varied by a series resistance associated with the supply voltage source.

4. A threshold value switch, as claimed in claim 1, including respective means connecting the drain electrode of each second field effect transistor to the gate electrode of the other second field effect transistor.

5. A threshold value switch, as claimed in claim 4, including respective diodes arranged in the connection between the drain electrode of each second transistor and the gate electrode of the other second transistor; means connecting each diode to a respective supply voltage terminal; said diodes being connected with respective polarities such that they are biased in blocking direction by the connected respective supply voltage terminal in the rest state of said switch.

6. A threshold value switch, as claimed in claim 5, including a capacitor connected in series in one connection between a drain electrode of a second field effect transistor and a gate electrode of the other second field effect transistor; and a resistor connecting the drain electrode of said one second field effect transistor to the respective supply voltage terminal.

7. A threshold value switch, as claimed in claim 1, including respective further voltage dividers each connecting the drain electrode of a respective second field effect transistor to that supply voltage terminal connected to the source electrode of the other second field effect transistor; and means connecting the substrate terminal of each second field effect transistor to the midpoint of that further voltage divider connected to the drain electrode of the other second field effect transistor.

* * * * *